US009153622B2

(12) United States Patent
Kim et al.

(10) Patent No.: US 9,153,622 B2
(45) **Date of Patent: *Oct. 6, 2015**

(54) SERIES OF LIGHT EMITTING REGIONS WITH AN INTERMEDIATE PAD

(71) Applicant: LG INNOTEK CO., LTD., Seoul (KR)

(72) Inventors: Sung Kyoon Kim, Seoul (KR); Yun Kyung Oh, Seoul (KR); Sung Ho Choo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 218 days.

This patent is subject to a terminal disclaimer.

(21) Appl. No.: 13/661,960

(22) Filed: Oct. 26, 2012

(65) Prior Publication Data

US 2013/0105828 A1 May 2, 2013

(30) Foreign Application Priority Data

Oct. 28, 2011 (KR) ........................ 10-2011-0111309

(51) Int. Cl.
*H01L 33/08* (2010.01)
*H01L 27/15* (2006.01)
*H01L 33/38* (2010.01)
*H01L 33/46* (2010.01)

(52) U.S. Cl.
CPC ............. *H01L 27/156* (2013.01); *H01L 33/382* (2013.01); *H01L 33/46* (2013.01)

(58) Field of Classification Search
CPC ...... H01L 33/46; H01L 33/382; H01L 27/156
USPC ........................... 257/88–93; 315/184, 185 R
See application file for complete search history.

(56) References Cited

U.S. PATENT DOCUMENTS

2007/0278502 A1 12/2007 Shakuda et al.
2010/0102732 A1* 4/2010 Peeters et al. ................. 315/161
2010/0213474 A1* 8/2010 Hsu et al. ........................ 257/89
2010/0252840 A1* 10/2010 Ibbetson et al. ................ 257/88
2012/0043563 A1* 2/2012 Ibbetson et al. ................ 257/88
2012/0187424 A1* 7/2012 Kim et al. ....................... 257/88
2012/0228580 A1* 9/2012 Wang et al. ..................... 257/13
2013/0161655 A1* 6/2013 Xu et al. ......................... 257/88
2013/0273673 A1* 10/2013 Hsu et al. ........................ 438/16

FOREIGN PATENT DOCUMENTS

EP 1 973 161 A2 9/2008
WO WO 2005/062389 A2 7/2005
WO WO 2010/044645 A2 4/2010

* cited by examiner

*Primary Examiner* — Peter Bradford
(74) *Attorney, Agent, or Firm* — Birch, Stewart, Kolasch & Birch, LLP

(57) ABSTRACT

Disclosed is a light emitting device including a light emitting structure including a plurality of light emitting regions including a first semiconductor layer, an active layer and a second semiconductor layer, and a plurality of boundary regions disposed between the light emitting regions, a first electrode unit disposed on the first semiconductor layer in one of the light emitting regions, a second electrode unit disposed on the second semiconductor layer in another of the light emitting regions, at least one connection electrode to electrically connect the first semiconductor layer of one of adjacent light emitting regions to the second semiconductor layer of the other thereof, and an intermediate pad disposed on the first semiconductor layer or the second semiconductor layer in at least one of the light emitting regions, wherein the light emitting regions are connected in series through the connection electrode.

20 Claims, 14 Drawing Sheets

SERIES OF LIGHT EMITTING REGIONS WITH AN INTERMEDIATE PAD

CROSS REFERENCE TO RELATED APPLICATION

This application claims priority under 35 U.S.C. §119 to Korean Patent Application No. 10-2011-0111309, filed in Korea on 28 Oct. 2011, which is hereby incorporated in its entirety by reference as if fully set forth herein.

TECHNICAL FIELD

Embodiments relate to a light emitting device, a light emitting device package, a lighting apparatus, and a display apparatus.

BACKGROUND

Red, green and blue light emitting diodes (LED) capable of realizing high luminance and white light were developed, based on development of metal organic chemical vapor deposition and molecular beam growth of gallium nitride (GaN).

Such LEDs do not contain environmentally harmful substances such as mercury (Hg) used in conventional lighting apparatuses such as incandescent lamps or fluorescent lamps and thus advantageously have superior eco-friendliness, long lifespan and low power consumption, thus being used as alternatives of conventional light sources. The key factors in competitiveness of such LEDs are to realize high luminance, based on chips with high efficiency and high power and packaging technologies.

In order to realize high luminance, an increase in light extraction efficiency is important. A variety of methods using flip-chip structures, surface texturing, patterned sapphire substrates (PSSs), photonic crystal techniques, anti-reflective layer structures and the like are being researched in order to increase light extraction efficiency.

In general, a light emitting device may include a light emitting structure to generate light, a first electrode and a second electrode to receive power, a current blocking layer to disperse light, an ohmic layer that ohmic-contacts the light emitting structure, and a reflective layer to improve light extraction efficiency. The structure of a general light emitting device is disclosed in Korean Patent Laid-open No. 10-2011-0041270.

SUMMARY

Embodiments provide a light emitting device to control emission of light with various brightness levels and increase an area of light emitting regions.

In one embodiment, a light emitting device includes: a light emitting structure divided into a plurality of light emitting regions including a first semiconductor layer, an active layer and a second semiconductor layer and at least one boundary region disposed between the light emitting regions; a first electrode unit disposed on the first semiconductor layer in one of the light emitting regions; a second electrode unit disposed on the second semiconductor layer in another of the light emitting regions; at least one connection electrode to electrically connect the first semiconductor layer of one of adjacent light emitting regions to the second semiconductor layer of the other thereof; and an intermediate pad disposed on the second semiconductor layer in at least one of the light emitting regions, wherein the light emitting regions are connected in series through the connection electrode.

In another embodiment, a light emitting device includes: a light emitting structure divided into a plurality of light emitting regions including a first semiconductor layer, an active layer and a second semiconductor layer; and at least one boundary region disposed between the light emitting regions; a first electrode unit disposed on the first semiconductor layer in one of the light emitting regions; a second electrode unit disposed on the second semiconductor layer in another of the light emitting regions; at least one connection electrode to electrically connect the first semiconductor layer of one of adjacent light emitting regions to the second semiconductor layer of the other thereof; and an intermediate pad disposed on the first semiconductor layer in at least one of the light emitting regions, wherein the light emitting regions are connected in series through the connection electrode.

The intermediate pad may be disposed on the second semiconductor layer in at least one of light emitting regions, other than light emitting regions in which the first electrode unit and the second electrode unit are positioned. Alternatively, the intermediate pad may be disposed on the first semiconductor layer in at least one of light emitting regions, other than light emitting regions in which the first electrode unit and the second electrode unit are positioned.

Each of the first electrode unit and the second electrode unit may include a pad to receive a power.

The intermediate pad may be electrically connected to the connection electrode disposed in the same light emitting region.

The light emitting device may further include: an insulating layer disposed in the light emitting regions and the boundary region, wherein the connection electrode is disposed on the insulating layer.

The intermediate pad may be separated from the connection electrode on the insulating layer in the same light emitting region. Alternatively, the intermediate pad may be integrated with the connection electrode on the insulating layer in the same light emitting region. The connection electrode may include a first portion that passes through the insulating layer and contacts the second semiconductor layer in one of the adjacent light emitting regions. The connection electrode may further include a second portion that passes through the insulating layer, the second semiconductor layer and the active layer, and contacts the first semiconductor layer in the other of the adjacent light emitting regions, wherein the insulating layer is disposed between the second portion and the second semiconductor layer, and between the second portion and the active layer.

A lower surface of the second portion of the connection electrode may be positioned to be lower than a lower surface of the active layer.

The light emitting device may further include: a substrate disposed under the light emitting structure; and a conductive layer disposed between the light emitting region and the insulating layer.

The second portion may pass through the conductive layer. The insulating layer may be disposed between the second portion and the conductive layer.

The first electrode unit may receive a first power, and at least one of the second electrode unit and the intermediate pad may receive a second power. Alternatively, one of the first electrode unit and the intermediate pad may receive a first power, and the second electrode unit may receive a second power.

In another embodiment, a light emitting device includes: a light emitting structure divided into a plurality of light emitting regions including a first semiconductor layer, an active layer and a second semiconductor layer; and at least one boundary region disposed between the light emitting regions; a first electrode unit disposed on the first semiconductor layer in one of the light emitting regions; a plurality of metal layers disposed under the second semiconductor layers in the respective light emitting regions; a second electrode unit electrically connected to the metal layer disposed under the second semiconductor layer in another of the light emitting regions; an insulating layer to electrically insulate the metal layers from each other; at least one connection electrode to electrically connect the first semiconductor layer of one of adjacent light emitting regions to the second semiconductor layer of the other thereof; and an intermediate pad disposed on the first semiconductor layer in at least one of the light emitting regions, wherein the light emitting regions are connected in series through the connection electrode.

Each metal layer may include at least one of an ohmic layer and a reflective layer.

The intermediate pad may be disposed on the first semiconductor layer in at least one of light emitting regions, other than a light emitting region, in which the first electrode unit is positioned, and a light emitting region, with which the second electrode unit is electrically connected.

The light emitting device may further include: a passivation layer disposed in the light emitting regions and the boundary region, wherein the connection electrode is disposed on the passivation layer.

The connection electrode may include: at least one first portion that passes through the passivation layer, the first semiconductor layer and the active layer, and contacts the second semiconductor layer in one of the adjacent light emitting regions; and at least one second portion that passes through the passivation layer, and contacts the first semiconductor layer in the other of the adjacent light emitting regions, wherein the passivation layer is disposed between the first portion and the first semiconductor layer, and between the first portion and the active layer.

The second electrode unit may include: a barrier layer electrically connected to the metal layer disposed under the second semiconductor layer in the another of the light emitting regions; and a support layer disposed under the barrier layer.

The light emitting device may further include: a current blocking layer disposed between the second semiconductor layer and the metal layer in each light emitting region, such that it corresponds to the connection electrode or the intermediate pad, the current blocking layer at least partially overlapping the connection electrode or the intermediate pad in a vertical direction.

The insulating layer may electrically insulate metal layers other than the metal layer electrically connected to the second electrode unit, from the second electrode unit.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
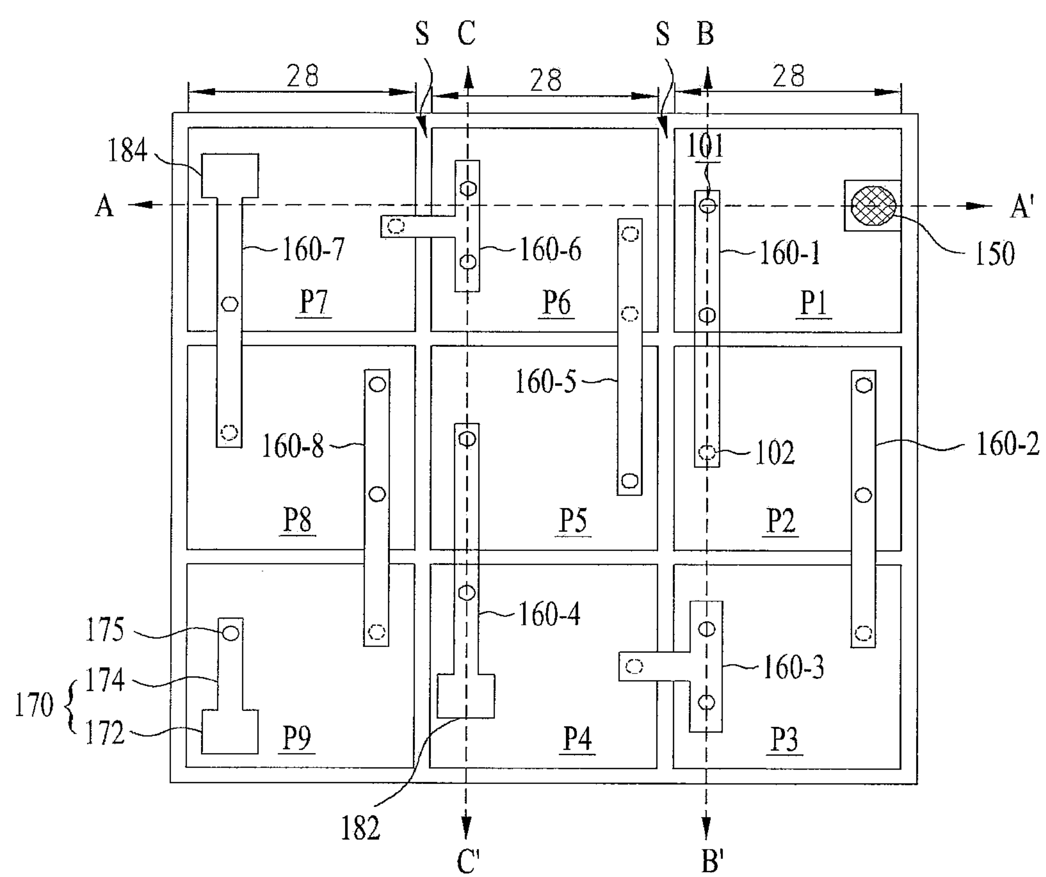
FIG. 1 is a plan view illustrating a light emitting device according to a first embodiment.

Hereinafter, embodiments will be clearly understood from description with reference to the annexed drawings.

It will be understood that when an element is referred to as being "on" or "under" another element, it can be directly on/under the element, and one or more intervening elements may also be present. When an element is referred to as being 'on' or 'under', 'under the element' as well as 'on the element' can be included based on the element.

In the drawings, the thickness or size of each layer is exaggerated, omitted, or schematically illustrated for convenience of description and clarity. Also, the size or area of each constituent element does not entirely reflect the actual size thereof. Hereinafter, a light emitting device, a method for manufacturing the same and a light emitting package including the light emitting device according to embodiments will be described with reference to the annexed drawings.

Figure 2:
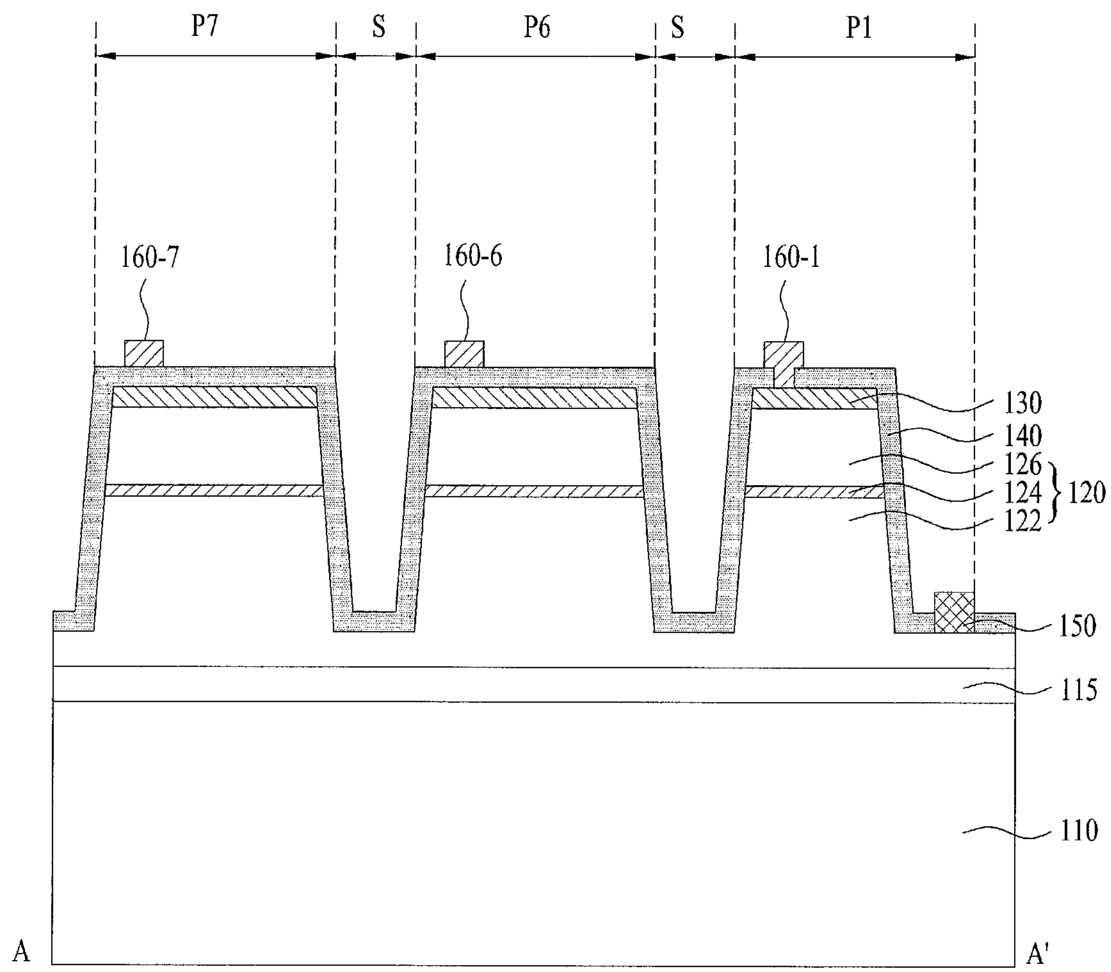
FIG. 2 is a sectional view taken along a direction of AA' of the light emitting device illustrated in FIG. 1.
Figure 3:
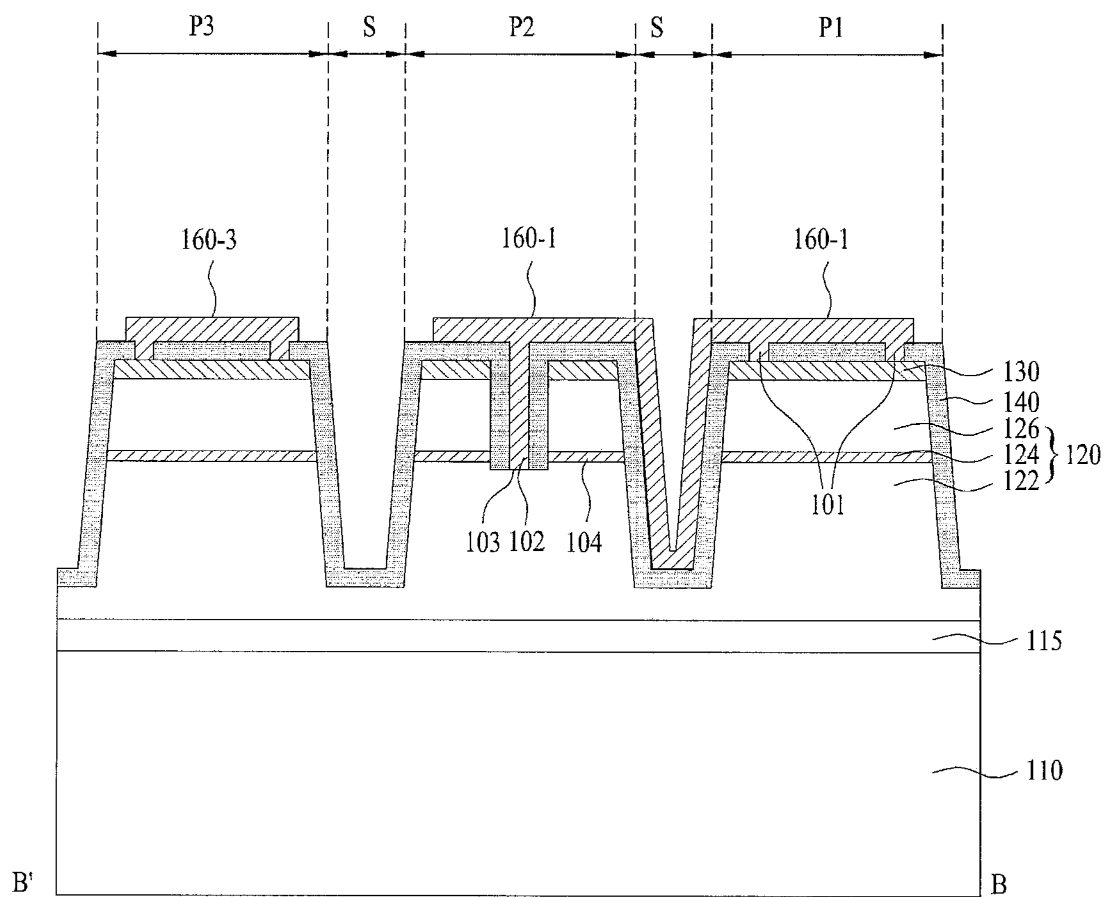
FIG. 3 is a sectional view taken along a direction of BB' of the light emitting device in FIG. 1.
Figure 4:
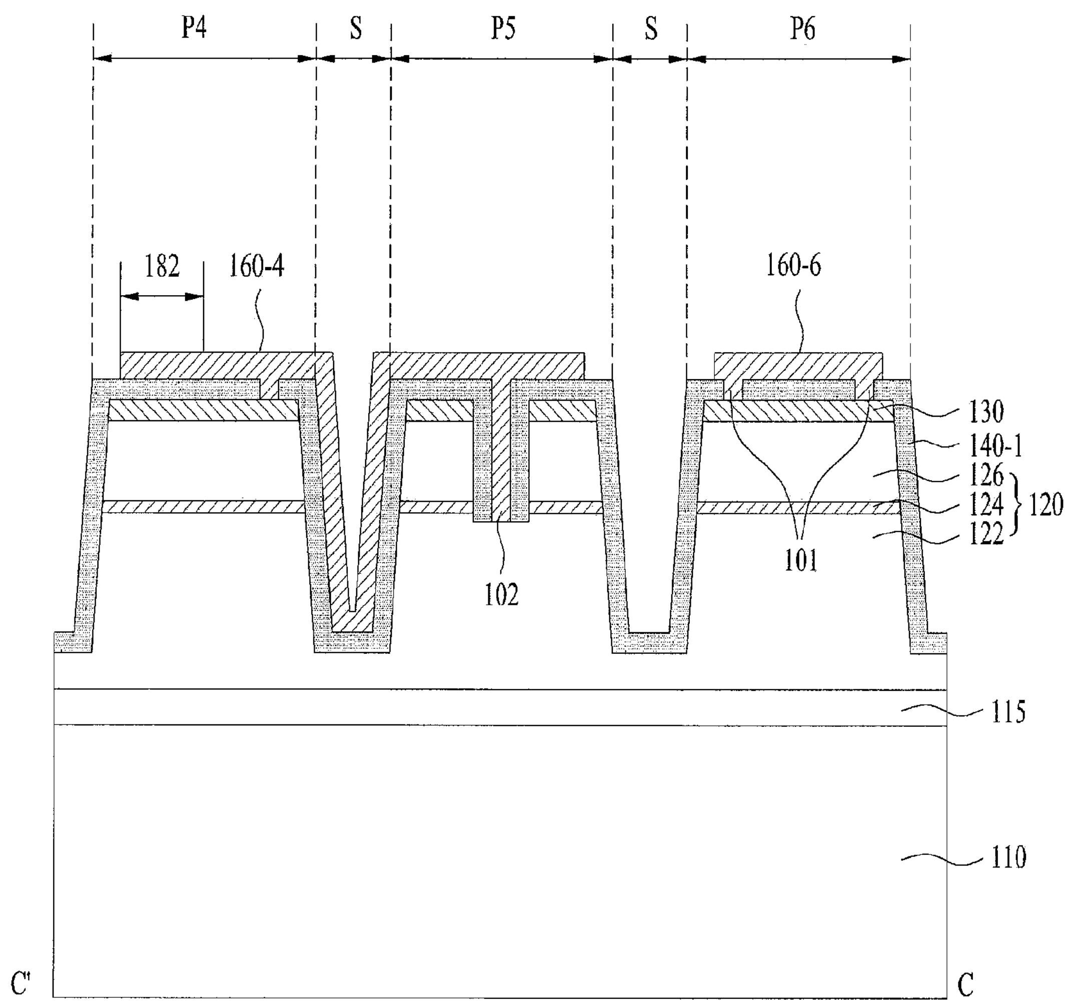
FIG. 4 is a sectional view taken along a direction of CC' of the light emitting device in FIG. 1.

FIG. 1 is a plan view illustrating a light emitting device 100 according to a first embodiment. FIG. 2 is a sectional view taken along a direction of AA' of the light emitting device 100 illustrated in FIG. 1. FIG. 3 is a sectional view taken along a direction of BB' of the light emitting device 100 illustrated in FIG. 1. FIG. 4 is a sectional view taken along a direction of CC' of the light emitting device 100 illustrated in FIG. 1

Referring to FIGS. 1 to 4, the light emitting device 100 includes a substrate 110, a buffer layer 115, a light emitting structure 120 divided into a plurality of light emitting regions P1 to Pn (in which n is a natural number greater than 1), a conductive layer 130, an insulating layer 140, a first electrode unit 150, at least one connection electrode 160-1 to **160-*m* (in which m is a natural number of 1 or more), at least one intermediate pad 182 and 184, and a second electrode unit 170**.

The substrate 110 may be formed with a carrier wafer, a material suitable for growth of semiconductor materials. In addition, the substrate 110 may be formed with a highly thermo-conductive material and may be a conductive substrate or an insulating substrate. For example, the substrate 110 may contain at least one of sapphire ($Al_2O_3$), GaN, SiC, ZnO, Si, GaP, InP, $Ga_2O_3$, and GaAs. A upper surface of the substrate 110 may be provided with a roughness.

The buffer layer 115 is interposed between the substrate 110 and the light emitting structure 120 and may be formed with a Group III-V compound semiconductor. The buffer layer 115 functions to reduce difference in lattice constant between the substrate 110 and the light emitting structure 120.

The light emitting structure 120 may be a semiconductor layer generating light and include a first conductive type semiconductor layer 122, an active layer 124, and a second conductive type semiconductor layer 126. The light emitting structure 120 may have a structure including the first conductive type semiconductor layer 122, the active layer 124, and the second conductive type semiconductor layer 126 sequentially stacked on the substrate 110.

The first conductive type semiconductor layer 122 may be formed with a semiconductor compound. The first conductive type semiconductor layer 122 may be realized with a Group III-V or Group II-VI compound semiconductor or the like, and may be doped with a first conductive dopant.

For example, the first conductive type semiconductor layer 122 may be a semiconductor having a compositional formula of $In_xAl_yGa_{1-x-y}N$ ($0 \le x \le 1$, $0 \le y \le 1$, $0 \le x+y \le 1$). For example, the first conductive type semiconductor layer 122 may contain any one of InAlGaN, GaN, AlGaN, InGaN, AlN, and InN and may be doped with an n-type dopant (for example, Si, Ge, or Sn).

The active layer 124 is interposed between the first conductive type semiconductor layer 122 and the second conductive type semiconductor layer 126, and may generate light through energy generated during recombination of electrons and holes supplied from the first conductive type semiconductor layer 122 and the second conductive type semiconductor layer 126, respectively.

The active layer 124 may be formed with a semiconductor compound, for example, a Group III-V or Group II-VI compound semiconductor, and may have a double-junction structure, a single well structure, a multiple well structure, a quantum wire structure or a quantum dot structure.

When the active layer 124 is a single well structure or a quantum well structure, it may include a well layer having a compositional formula of $In_xAl_yGa_{1-x-y}N$ ($0 \le x \le 1$, $0 \le y \le 1$, $0x+y \le 1$) and a barrier layer having a compositional formula of $In_aAl_bGa_{1-a-b}N$ ($0 \le a \le 1$, $0 \le b \le 1$, $0 \le a+b \le 1$). The well layer may be made of a material having a lower band gap than that of the barrier layer.

The second conductive type semiconductor layer 126 may be formed with a semiconductor compound. The second conductive type semiconductor layer 126 may be realized with a Group III-V or Group II-VI compound semiconductor and be doped with a second conductive dopant.

For example, the second conductive type semiconductor layer 126 may be a semiconductor having a compositional formula of $In_xAl_yGa_{1-x-y}N$ ($0 \le x \le 1$, $0 \le y \le 1$, $0 \le x+y \le 1$). For example, the second conductive type semiconductor layer 126 may contain any one of GaN, AlN, AlGaN, InGaN, InN, InAlGaN, AlInN, AlGaAs, GaP, GaAs, GaAsP, and AlGaInP and be doped with a p-type dopant (for example, Mg, Zn, Ca, Sr, or Ba).

The light emitting structure 120 may expose a part of the first conductive type semiconductor layer 122. That is, the light emitting structure 120 may expose a part of the first conductive type semiconductor layer 122 by etching the second conductive type semiconductor layer 126, the active layer 124 and the part of the first conductive type semiconductor layer 122. In this case, the surface of the first conductive type semiconductor layer 122 exposed by mesa-etching may be positioned to be lower than the lower surface of the active layer 124.

A conductive clad layer (not shown) may be interposed between the active layer 124 and the first conductive type semiconductor layer 122, or between the active layer 124 and the second conductive type semiconductor layer 126 and the conductive clad layer may be formed with a nitride semiconductor (for example, AlGaN).

The light emitting structure 120 may further include a third conductive semiconductor layer (not shown) disposed under the second conductive type semiconductor layer 126, and the third conductive semiconductor layer may have an opposite polarity to the second conductive type semiconductor layer 126. The first conductive type semiconductor layer 122 may be realized with an n-type semiconductor layer and the second conductive type semiconductor layer 126 may be realized with a p-type semiconductor layer. Accordingly, the light emitting structure 120 may include at least one of N-P, P-N, N-P-N and P-N-P junction structures.

The light emitting structure 120 may include a plurality of light emitting regions spaced from one another P1 to Pn (in which n is a natural number greater than 1) and at least one boundary region S. The boundary region S may be positioned between the light emitting regions P1 to Pn (in which n is a natural number greater than 1). Alternatively, the boundary region S may be positioned on the circumferences of the light emitting regions P1 to Pn (in which n is a natural number greater than 1). The boundary S may include a region where a part of the light emitting structure 120 is exposed, formed by mesa-etching the light emitting structure 120, in order to divide the light emitting structure 120 into a plurality of light emitting regions P1 to Pn (in which n is a natural number greater than 1). Areas of the light emitting regions P1 to Pn (in which n is a natural number greater than 1) may be identical, but the disclosure is not limited thereto.

The light emitting structure 120 of a single chip may be divided into the light emitting regions P1 to Pn (in which n is a natural number greater than 1) through the boundary region S.

The conductive layer 130 is disposed on the second conductive type semiconductor layer 126. The conductive layer 130 reduces total reflection and exhibits superior transmittance, thus increasing an extraction efficiency of light emitted from the active layer 124 to the second conductive type semiconductor layer 126. The conductive layer 130 may be realized with a single or multiple layer structure using one or more transparent oxide substances having high transmittance to light emission wavelengths, such as indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrOx, RuOx, RuOx/ITO, Ni, Ag, Ni/IrOx/Au or Ni/IrOx/Au/ITO.

The insulating layer 140 is positioned on the light emitting regions P1 to Pn (in which n is a natural number greater than 1) and the boundary region S. The insulating layer 140 may be formed of a light-transmissive insulating material, for example, $SiO_2$, $SiO_x$, $SiO_xN_y$, $Si_3N_4$, or $Al_2O_3$. For example, the insulating layer 140 may cover upper parts and sides of the light emitting regions P1 to Pn (in which n is a natural number greater than 1) and cover the boundary region S.

The first electrode unit 150 is disposed on the first conductive type semiconductor layer 122 in one light emitting region (for example, P1) of the light emitting regions P1 to Pn (for example, n=9) and may contact the first conductive type semiconductor layer 122. The first electrode unit 150 may include a first pad bonded to a wire (not shown) to supply a first power. In the embodiment of FIG. 1, the first electrode unit 150 may serve as the first pad.

The second electrode unit 170 is disposed on the second conductive type semiconductor layer 126 in another light emitting region (for example, P9) among the light emitting regions P1 to Pn (for example, n=9). The second electrode unit 170 may contact the second conductive type semiconductor layer 126 or the conductive layer 130. For example, the second electrode unit 170 may contact the conductive layer 130 of the last light emitting region (for example, P9) among the light emitting regions connected in series.

The second electrode unit 170 may include a second pad 173 and a branch electrode 174 disposed on the insulating layer 140. The second pad 172 is bonded to a wire (not shown) to supply a power, and the branch electrode 174 extends from the second pad 172 and includes at least one portion 175 that passes through the insulating layer 140 and contacts the conductive layer 130.

The connection electrodes 160-1 to 160-*m* (for example, m=8) are disposed on the insulating layer 140 and electrically connect a plurality of light emitting regions P1 to Pn (for example, n=9) in series. For example, the connection electrodes 160-1 to 160-*m* (for example, m=8) connect a plurality of light emitting regions P1 to P9 in series, from a first light emitting region P1, in which the first electrode unit 150 is disposed, as a start point, to the ninth light emitting region P9 in which the second electrode unit 170 is disposed, as an end point.

Each connection electrode (for example, 160-1) may electrically connect the conductive layer 130 of one light emitting region (for example, P1) of two adjacent light emitting regions (for example, P1 and P2) to the first conductive type semiconductor layer 122 of the other light emitting region (for example, P2) thereof.

In another embodiment excluding the conductive layer 130, the connection electrode (for example, 160-1) may electrically connect the second conductive type semiconductor layer 126 of one light emitting region (for example, P1) to the first conductive type semiconductor layer 122 of the other light emitting region (for example, P2).

A plurality of light emitting regions P1 to Pn (in which n is a natural number greater than 1) connected to one another in series included in the light emitting device 100 are referred to as a $1^{st}$ light emitting region to an $n^{th}$ light emitting region in order. That is, the light emitting region in which the first electrode unit 150 is disposed is referred to as a $1^{st}$ light emitting region P1 and the light emitting region in which the second electrode unit 170 is disposed is referred to as an $n^{th}$ light emitting region Pn. Here, "adjacent light emitting regions" may be a $k^{th}$ light emitting region and a $K+1^{th}$ light emitting region, the $k^{th}$ connection electrode may electrically connect the $k^{th}$ light emitting region to the $K+1^{th}$ light emitting region in series, where $1 \le k \le (n-1)$.

That is, the $k^{th}$ connection electrode may electrically connect the second conductive type semiconductor layer 126 or conductive layer 130 of the $k^{th}$ light emitting region to the first conductive type semiconductor layer 122 of the $k+1^{th}$ light emitting region.

For example, referring to FIG. 3, the $k^{th}$ connection electrode (for example, k1) may be positioned in the $k^{th}$ light emitting region (for example, k=1), the $k+1^{th}$ light emitting region (for example, k+1=2), and the boundary S provided therebetween. Also, the $k^{th}$ connection electrode (for example, 160-1) may include at least one first portion (for example, 101) that passes through the insulating layer 140 and contacts the conductive layer 130 (or second conductive type semiconductor layer 126) of the $k^{th}$ light emitting region (for example, P1). A full-lined circle illustrated in FIG. 1 represents a first portion 101 of connection electrodes 160-1 to 160-*m* (for example, m=8).

The insulating layer 140 may be disposed between the light emitting structure 120 and the connection electrode 160-1 in the boundary S.

In addition, the $k^{th}$ connection electrode (for example, 160-1) may include at least one second portion (for example, 102) that passes through the insulating layer 140, the conductive layer 130, the second conductive type semiconductor layer 126, and the active layer 124 of the $k+1^{th}$ light emitting region (for example, P2) and contacts the first conductive type semiconductor layer 122. A dot-lined circle illustrated in FIG. 1 represents the second portion 102 of the connection electrode 160-1 to 160-*m* (for example, m=8).

The insulating layer 140 may be disposed between the $K^{th}$ connection electrode (for example, 160-1) and the conductive layer 130, between the second portion 102 of the $K^{th}$ connection electrode (for example, 160-1) and the second conductive type semiconductor layer 126, and between the second portion 102 of the connection electrode (for example, 160-1) and the active layer 124.

In general, in order to form an electrode connected to the first conductive type semiconductor layer, mesa etching to expose the first conductive type semiconductor layer by etching the light emitting structure is performed. In general, the light emitting region of the light emitting device is decreased in proportion to the mesh-etched region.

However, the second portion (for example, 102) of the $k^{th}$ connection electrode (for example, 160-1) may have a structure of a hole or groove filled with an electrode material. For this reason, the light emitting region lost by mesa etching is decreased and in this embodiment, a light emitting area may be increased.

The insulating layer 140 functions to electrically insulate the $k^{th}$ connection electrode (for example, 160-1) from the conductive layer 130, the second conductive type semiconductor layer 126 and the active layer 124 of the $k+1^{th}$ light emitting region (for example, P2).

A lower surface 103 of the second portion 102 of the $k^{th}$ connection electrode (for example, 160-1) may be disposed to be lower than a lower surface of 104 of the active layer 124. The second portion 102 may have a structure of a hole or groove filled with an electrode material.

The intermediate pads 182 and 184 are disposed on the insulating layer 140 in at least one of the light emitting regions P1 to Pn (in which n is a natural number greater than 1) and may be electrically connected to the second conductive type semiconductor layer 126 or the conductive layer 130. The intermediate pads 182 and 184 may be regions bonded to wires to supply a second power.

For example, the intermediate pads 182 and 184 may be disposed on the insulating layer 140 in at least one light emitting region (for example, P4 and P7) among the light emitting regions (for example, P2 to P8), other than light emitting regions (for example, P1 and P9) in which the first electrode unit 150 and the second electrode portion 172 are positioned.

As shown in FIG. 4, the insulating layer 140 is interposed between the intermediate pad 182 or 184, and the conductive layer 130, and the intermediate pad (for example, 182) may be connected to any one (for example, 160-4) of the connection electrodes (for example, 160-3 and 160-4) disposed in the same light emitting region (for example, P4).

However, in other embodiments, a part of the intermediate pad passes through the insulating layer and is directly connected to the conductive layer. In this case, the intermediate pad and the connection electrode positioned in the same light emitting region may be connected, or may be not connected.

Figure 5:
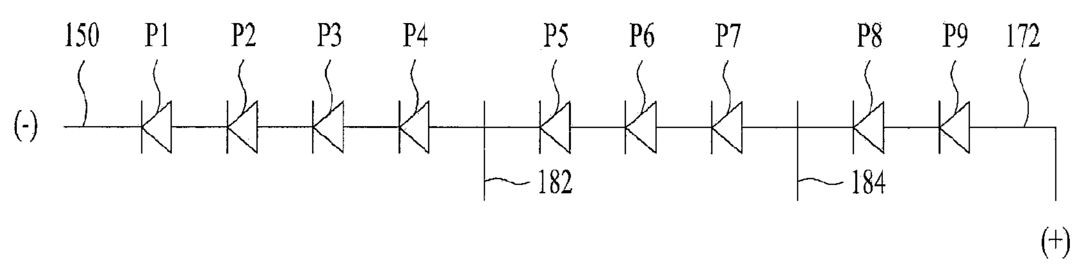
FIG. 5 is a circuit diagram of the light emitting device illustrated in FIG. 1.

FIG. 5 is a circuit diagram of the light emitting device 100 illustrated in FIG. 1. Referring to FIGS. 1 and 5, the light emitting device 100 has a common single (−) terminal, for example, a first pad 150, and two or more (+) terminals, for example, a second pad 172 and at least one intermediate pad 182 and 184.

Accordingly, in this embodiment, the light emitting device includes a plurality of (+) terminals, pads 172, 182 and 184, thus enabling use of various driving voltages and enabling control of emission of light with various brightness levels. For example, in a case in which a driving voltage to drive one light emitting region is 3.4V, when a driving voltage applied to the light emitting device 100 is 13.6V, a second power is applied to the first intermediate pad 182 to drive the first to fourth light emitting regions P1 to P4.

Also, when a driving voltage applied to the light emitting device 100 is 23.8V, a second power is applied to the second intermediate pad 184 to drive the first to seventh light emitting regions P1 to P7. Also, when a driving voltage applied to the light emitting device 100 is 30.6V, a second power is applied to the second pad 172 to drive the first to ninth light emitting regions P1 to P9.

This embodiment may be designed such that a part or entirety of light emitting regions is driven by supplying a second power to any one of the intermediate pads 182 and 184, and the second pad 170 according to applied driving voltage.

In addition, in this embodiment, the light emitting area can be increased, current is dispersed and light-emission efficiency can thus be improved, because the connection electrodes 160-1 to **160-*m* (in which m is a natural number of or more) point-contact the conductive layer 130 or the first conductive type semiconductor layer 122**.

Figure 6:
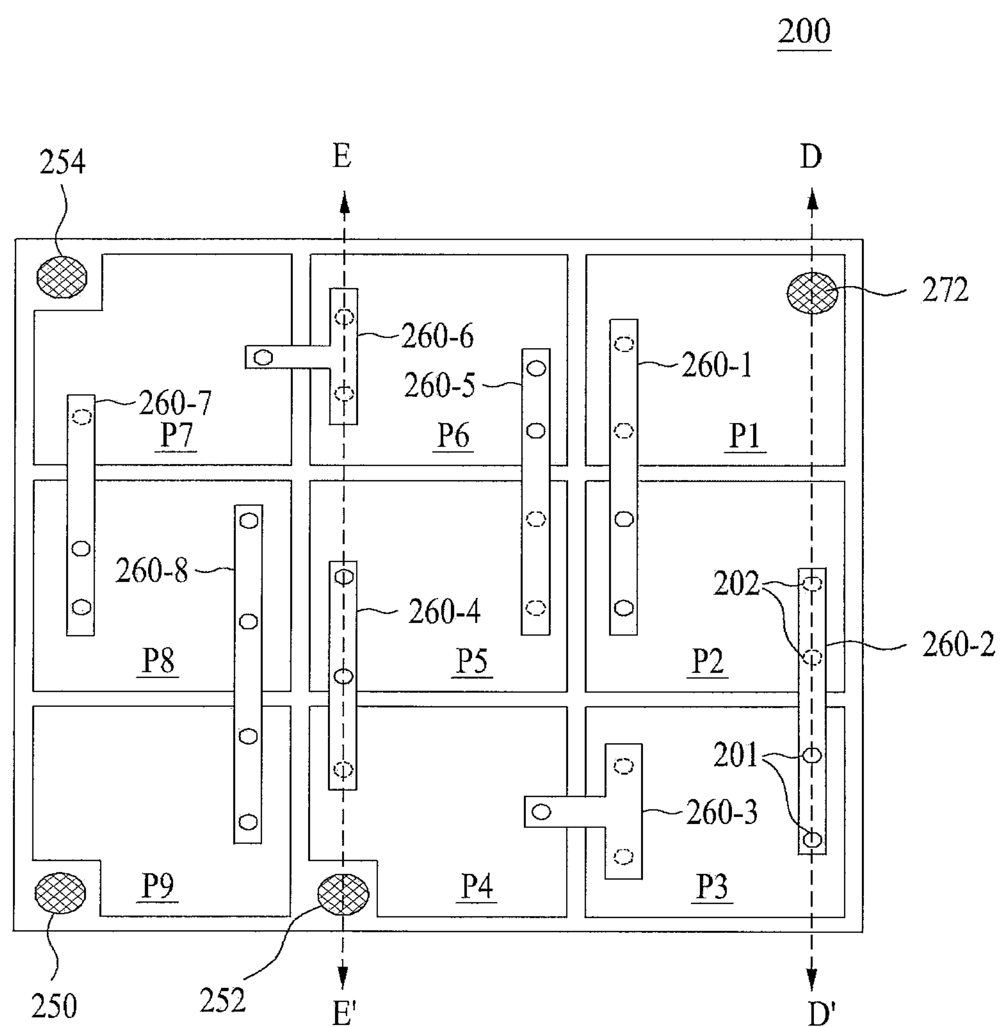
FIG. 6 is a plan view illustrating a light emitting device according to a second embodiment.
Figure 7:
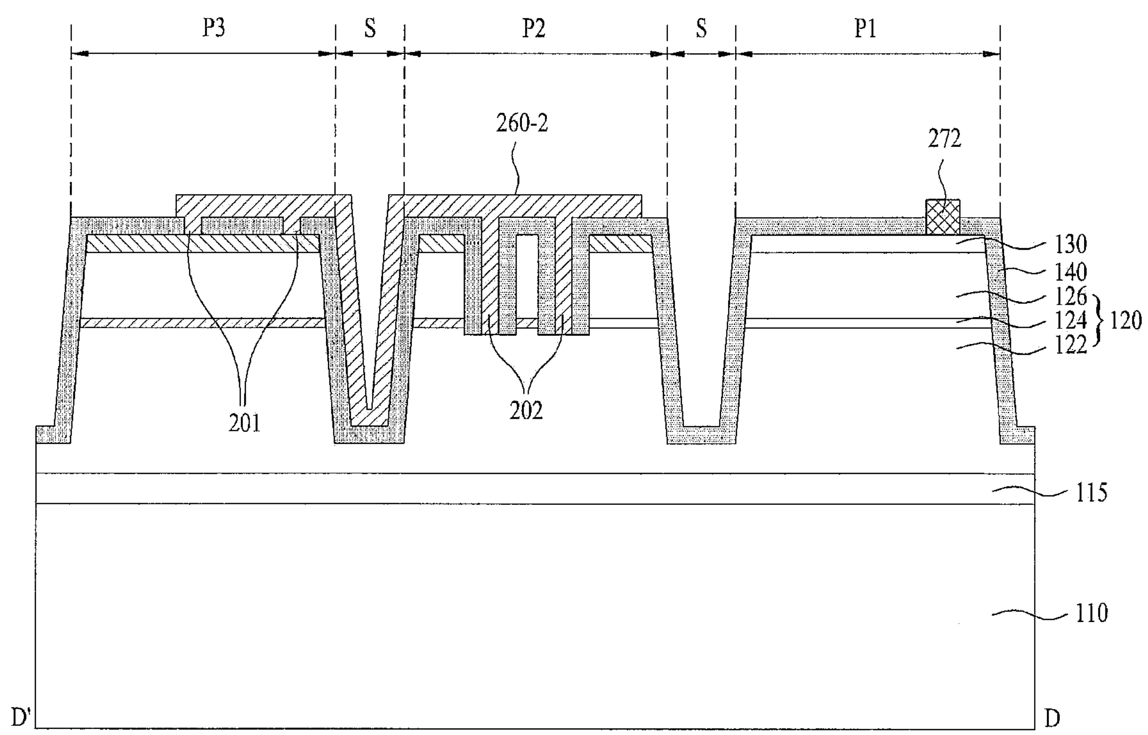
FIG. 7 is a sectional view taken along a direction of DD' of the light emitting device illustrated in FIG. 6.
Figure 8:
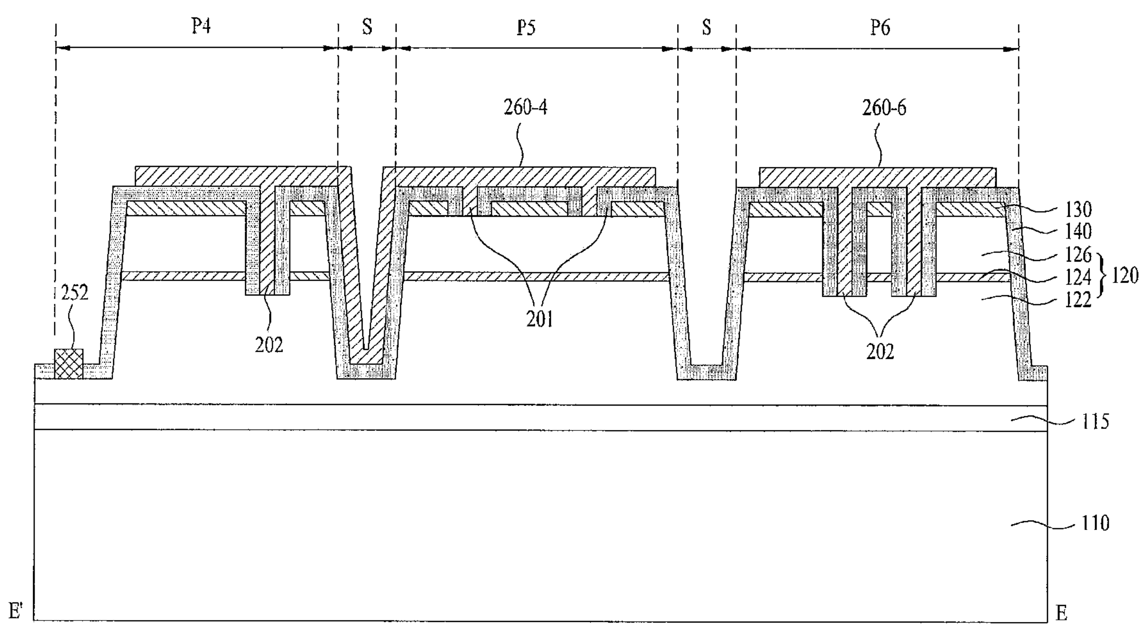
FIG. 8 is a sectional view taken along a direction of EE' of the light emitting device illustrated in FIG. 6.

FIG. 6 is a plan view illustrating a light emitting device 200 according to a second embodiment. FIG. 7 is a sectional view taken along a direction of DD' of the light emitting device 200 illustrated in FIG. 6. FIG. 8 is a sectional view taken along a direction of EE' of the light emitting device 200 illustrated in FIG. 6. The same drawing reference numerals as in FIGS. 1 to 4 represent the same configuration and the aforementioned descriptions are omitted or summarized.

Referring to FIGS. 6 to 8, the light emitting device 200 includes a substrate 110, a buffer layer 115, a light emitting structure 120 divided into a plurality of light emitting regions P1 to Pn (in which n is a natural number greater than 1), a conductive layer 130, an insulating layer 140, a first electrode unit 250, at least one connection electrode 260-1 to **260-*m* (in which m is a natural number of 1 or more), at least one intermediate pad 252 and 254, and a second electrode unit 272**.

The first electrode unit 250 is disposed on the first conductive type semiconductor layer 122 in one light emitting region (for example, P9) among the light emitting regions P1 to Pn (for example, n=12) and may contact the first conductive type semiconductor layer 122. The first electrode unit 250 may include a first pad bonded to a wire (not shown) to supply a first power. In the embodiment of FIG. 6, the first electrode unit 250 may serve as the first pad.

The second electrode unit 272 is disposed in the second conductive type semiconductor layer 126 in another light emitting region (for example, P1) among the light emitting regions P1 to Pn (for example, n=9). Also, the second electrode unit 272 may contact the second conductive type semiconductor layer 126 or the conductive layer 130.

For example, the second electrode unit 272 is disposed on the conductive layer 130 in the first light emitting region P1 among the light emitting regions connected in series, and the first electrode unit 250 may be disposed on the first conductive type semiconductor layer 122 in the last light emitting region P9. The second electrode unit 272 may include a second pad bonded to a wire (not shown) to supply a second power. In another embodiment, the second electrode unit 272 may further include a branch electrode (not shown) that extends from the second pad.

The insulating layer 140 may be disposed in a plurality of light emitting regions P1 to Pn (in which n is a natural number greater than 1) and on the boundary S. The connection electrodes 260-1 to **260-*m* (for example, m=8) are disposed on the insulating layer 140 and electrically connect a plurality of light emitting regions P1** to Pn (for example, n=9) in series.

Each connection electrode (for example, 260-1) may electrically connect the first conductive type semiconductor layer 122 of one light emitting region (for example, P1) of adjacent light emitting regions (for example, P1 and P2) to the second conductive type semiconductor layer 126 or the conductive layer 130 in the other light emitting region (for example, P2) thereof.

That is, the $k^{th}$ connection electrode **260-*k* may electrically connect the second conductive type semiconductor layer 126 or the conductive layer 130 of the $k+1^{th}$ light emitting region to the first conductive type semiconductor layer 122 of the $k^{th}$ light emitting region, where $1 \le k \le (n-1)$. For example, referring to FIG. 6, the $k^{th}$ connection electrode 260-*k* (for example, k=1) may be disposed in the $k^{th}$ light emitting region (for example, k=1), the $k+1^{th}$ light emitting region (for example, k=1), and the boundary S provided therebetween. Also, the $k^{th}$ connection electrode 260-*k* (for example k=2) may have at least one first portion (for example, 201) that passes through the insulating layer 140 and contacts the conductive layer 130 (or second conductive type semiconductor layer 126) of the $k+1^{th}$ light emitting region (for example, P3**).

The insulating layer 140 may be interposed between the light emitting structure 120 and the connection electrode 260-1 to **260-*m*** (in which m is a natural number of 1 or more) in the boundary S.

In addition, the $k^{th}$ connection electrode **260-*k* (for example, k=2) may include at least one second portion (for example, 202) that passes through the insulating layer 140, the conductive layer 130, the second conductive type semiconductor layer 126 and the active layer 124 of the $k^{th}$ light emitting region (for example, P=2) and contacts the first conductive type semiconductor layer 122. In this case, the insulating layer 140 may be disposed between the $k^{th}$ connection electrode 260-*k* (for example k=2) and the conductive layer 130, between the second portion 202 of the kth connection electrode 260-*k* (for example k=2) and the second conductive type semiconductor layer 126, and between the second portion 202 of the $k^{th}$ connection electrode 260-*k* (for example k=2) and the active layer 124**.

The intermediate pads 252 and 254 are disposed on the first conductive type semiconductor layer 122 of at least one of the light emitting regions P1 to Pn (in which n is a natural number greater than 1). The intermediate pads 252 and 254 may be bonded to wires (not shown) to supply a first power.

As shown in FIG. 8, a part of the first conductive type semiconductor layer 122 is exposed by mesa-etching at least one among the light emitting regions (for example, P2 to P8) and the intermediate pads 252, and 254 may be disposed on the part of the exposed first conductive type semiconductor layer 122.

For example, the intermediate pads 252 and 254 may be disposed on the first conductive type semiconductor layer 122 in at least one light emitting region (for example, P4 and P7) among the light emitting regions (for example, P2 to P8), other than light emitting regions (for example, P1 and P9) where the first electrode unit 250 and the second electrode unit 272 are positioned.

Figure 9:
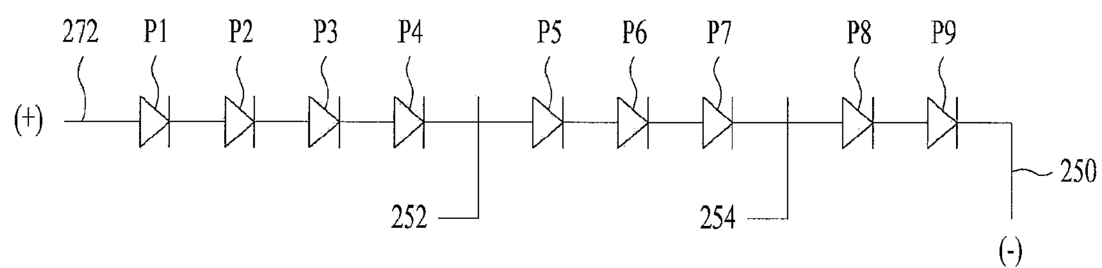
FIG. 9 is a circuit diagram of the light emitting device illustrated in FIG. 6.

FIG. 9 is a circuit diagram of the light emitting device 200 illustrated in FIG. 6. Referring to FIGS. 6 and 9, the light emitting device 200 has a common single (+) terminal, for example, a second pad 272, and two or more (−) terminals, for example, a first pad 250 and at least one intermediate pad 252 and 254.

Accordingly, in this embodiment, the light emitting device includes two or more (−) terminals, pads 250, 252 and 254, thus enabling use of various driving voltages and enabling control of emission of light with various brightness levels.

Figure 10:
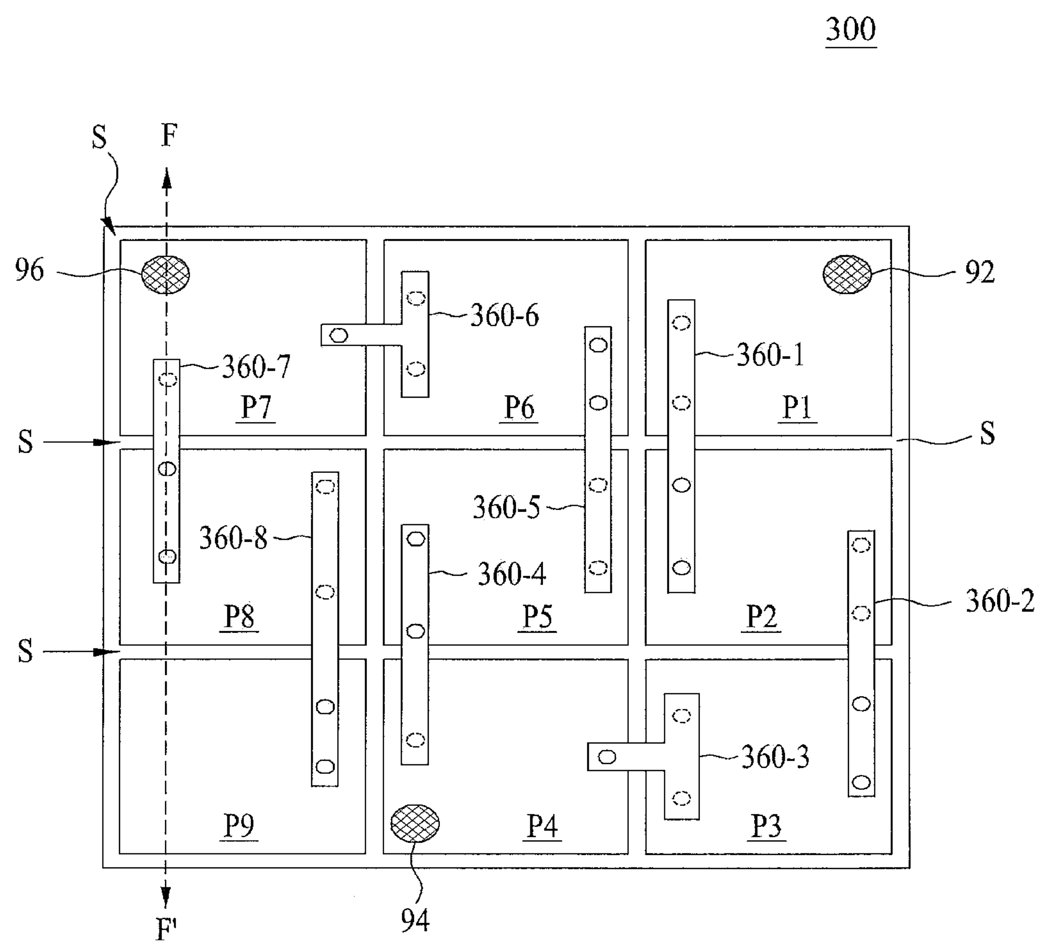
FIG. 10 is a plan view illustrating a light emitting device according to a third embodiment.
Figure 11:
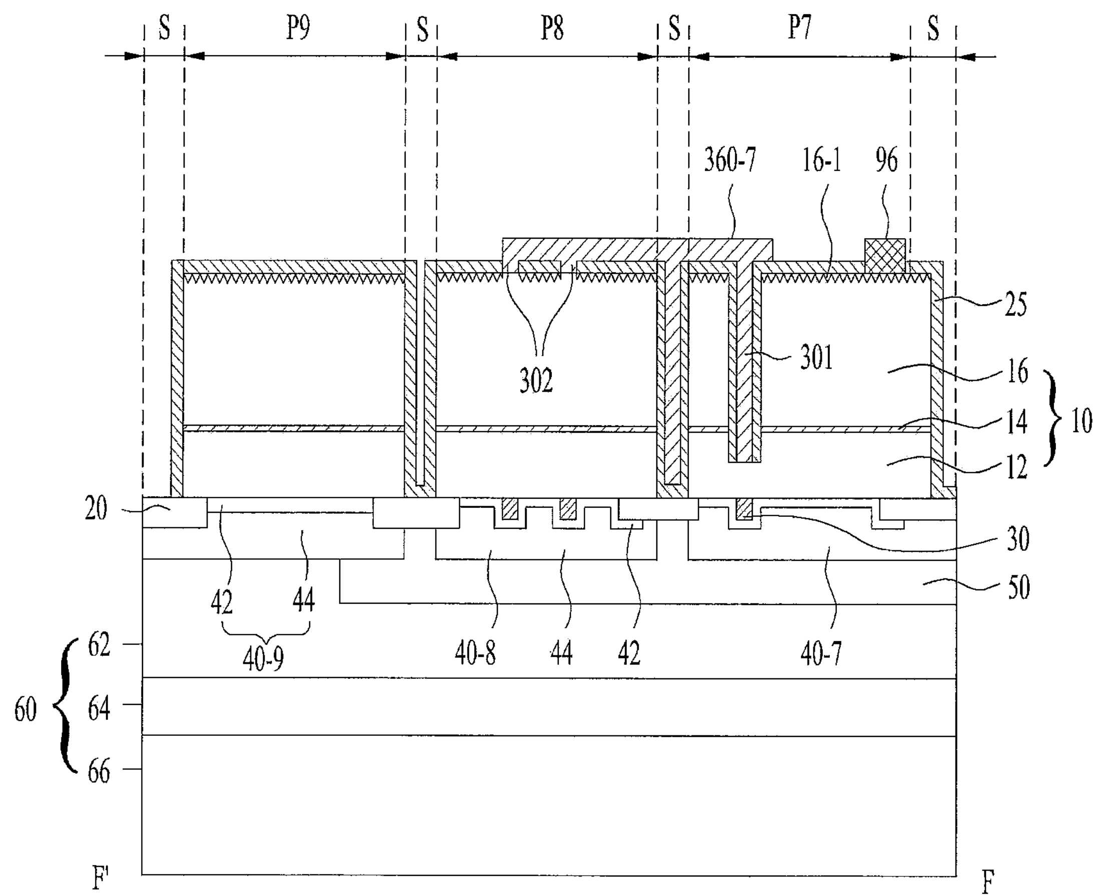
FIG. 11 is a sectional view taken along a direction of FF' of the light emitting device illustrated in FIG. 10.

FIG. 10 is a plan view illustrating a light emitting device 300 according to a third embodiment. FIG. 11 is a sectional view taken along a direction of FF' of the light emitting device 300 illustrated in FIG. 10.

Referring to FIGS. 10 and 11, the light emitting device 300 includes a light emitting structure 10 divided into a plurality of light emitting regions P1 to Pn (in which n is a natural number greater than 1), a protective layer 20, a current blocking layer 30, a plurality of metal layers 40-1 to 40-*n* (in which n is a natural number greater than 1), an insulating layer 50, a second electrode unit 60, a passivation layer 25, a first electrode unit 92, at least one connection electrode 360-1 to 360-*m* (in which m is a natural number of 1 or more), and at least one intermediate pad 94 and 96.

The light emitting structure 10 may generate light and include a plurality of compound semiconductor layers containing Group III-V elements. As shown in FIG. 11, the light emitting structure 10 may include a first conductive type semiconductor layer 16, an active layer 14 and a second conductive type semiconductor layer 12.

The second conductive type semiconductor layer 12 may be positioned under the first conductive type semiconductor layer 16 and the active layer 14 may be positioned between the first conductive type semiconductor layer 16 and the second conductive type semiconductor layer 12. The light emitting structure 10 may include a plurality of light emitting regions spaced from one another P1 to Pn (in which n is a natural number greater than 1) and at least one boundary region S. The first conductive type semiconductor layer 16, the active layer 14 and the second conductive type semiconductor layer 12 may be the same, as described in FIGS. 1 and 2.

The protective layer 20 may be disposed under the boundary S. The protective layer 20 or the boundary S may define light emitting regions P1 to Pn (in which n is a natural number greater than 1). The protective layer 20 protects light emitting regions P1 to Pn (in which n is a natural number greater than 1) and thereby prevents deterioration in reliability of the light emitting device 300 during isolation etching to divide the light emitting structure 20 into a plurality of light emitting regions P1 to Pn (in which n is a natural number greater than 1).

Each of the light emitting regions P1 to Pn (for example, n=9) may have a structure in which the second conductive type semiconductor layer 12, the active layer 14 and the first conductive type semiconductor layer 16 are stacked in a vertical direction. Here, the vertical direction may be a direction from the second conductive type semiconductor layer 12 to the first conductive type semiconductor layer 16, or a direction vertical to the support layer 66.

The metal layers 40-1 to 40-*n* (in which n is a natural number greater than 1) may be disposed under the light emitting structure. The metal layers 40-1 to 40-*n* (in which n is a natural number greater than 1) may be spaced from one another under the second conductive type semiconductor layer 12 in the corresponding one of the light emitting regions P1 to Pn (in which n is a natural number greater than 1).

FIG. 11 illustrates only metal layers 40-7, 40-8 and 40-9 corresponding to the light emitting regions P7, P8 and P9, respectively, and does not illustrate metal layers 40-1 to 40-6 corresponding to other light emitting regions P1 to P6. Each metal layer 40-1 to 40-*n* (for example, n=9) may include at least one of an ohmic layer 42 and a reflective layer 44.

The ohmic layer 42 is disposed under the light emitting regions P1 to Pn (for example, n=9) and may ohmic-contact the second conductive type semiconductor layer 12. For example, the ohmic layer 42 may contain at least one of In, Zn, Ag, Sn, Ni, and Pt.

The reflective layer 44 may be disposed under the ohmic layer 42 in the light emitting regions P1 to Pn (for example, n=12) and reflects light emitted from the light emitting structure 10 to improve light extraction efficiency of the light emitting device 300. The reflective layer 44 may contact the outermost side of the ohmic layer 42 and surround the ohmic layer 42.

The reflective layer 44 may contain at least one of a reflective metal or an alloy thereof for example, Ag, Ni, Al, Rh, Pd, Ir, Ru, Mg, Zn, Pt, Au, and Hf. In addition, the reflective layer 44 may have a single or multiple layer structure using a light-transmissive conductive oxide, for example, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO) or the like. In addition, the reflective layer 44 may have a multilayer structure containing a composite of metal and conductive oxide, such as IZO/Ni, AZO/Ag, IZO/Ag/Ni, or AZO/Ag/Ni.

In another embodiment, without separately forming the ohmic layer 42, it may be designed that the reflective layer ohmic-contacts the second conductive type semiconductor layer 12 by using a material for the reflective layer 44 as a material that ohmic-contacts the second conductive type semiconductor layer 12.

The current blocking layer 30 may be disposed under the second conductive type semiconductor layer 12 in the light emitting structure 10. For example, the current blocking layer 30 may be disposed between the second conductive type semiconductor layer 12 and the metal layer 40-1 to 40-*n* (in which n is a natural number greater than 1) in each of the light emitting regions P1 to Pn (for example, n=9). The current blocking layer 30 reduces concentration of current in a certain region of the light emitting regions P1 to Pn (for example, n=9) and thereby improves light emission efficiency of the light emitting device 300.

The current blocking layer 30 may be disposed to correspond to the connection electrodes 360-1 to 360-*m* (in which m is a natural number of 1 or more), or the first electrode unit 92, or intermediate pads 94 and 96, and at least partially overlaps the connection electrodes 360-1 to 360-*m*, or the first electrode unit 92, or intermediate pads and 96 in a vertical direction. The current blocking layer 30 may have a pattern corresponding to a pattern of the connection electrode 360-1 to 360-*m* (in which m is a natural number of 1 or more). Here, the vertical direction may be a direction from the second conductive type semiconductor layer 12 to the first conductive type semiconductor layer 16.

The current blocking layer 30 may be formed with a material having a lower electrical conductivity than metal layers 40-1 to **40-*n* (in which n is a natural number greater than 1), a material that Schottky-contacts the second conductive type semiconductor layer 12, or an electrical insulating material. For example, the current blocking layer 30** may contain at least one of ZnO, $SiO_2$, SiON, $Si_3N_4$, $Al_2O_3$, $TiO_2$, Ti, Al, and Cr.

The second electrode unit 60 is positioned under the insulating layer 50 and may be electrically connected to the metal layer (for example, 40-9) that contacts the second conductive type semiconductor layer 12 in one (for example, P9) of the light emitting regions. The second electrode unit 60 may supply a second power to the one light emitting region (for example, P9).

The second electrode unit 60 may include a barrier layer, 62, a bonding layer 64 and a support layer 66.

The barrier layer 62 is disposed under the reflective layer 44 in the light emitting regions P1 to Pn (for example, n=9), and prevents metal ions of the support layer 66 from passing through the reflective layer 44 and the ohmic layer and being then transferred or diffused to the light emitting structure. The barrier layer 62 contains a barrier metal material, for example at least one of Pt, Ti, W, V, Fe, and Mo, and may have a single or multiple layer structure.

The barrier layer 62 is positioned under the insulating layer 50 and may be electrically connected to the metal layer (for example, 40-9) that contacts the second conductive type semiconductor layer 12 in one (for example, P9) of the light emitting regions.

Since the second conductive type semiconductor layer 12 positioned in the ninth light emitting region (for example, P9) among the light emitting regions P1 to Pn (in which n is a natural number greater than 1) is electrically connected to the barrier layer 62, the second power may be supplied through the barrier layer 62 to the ninth light emitting region (for example, P9). The reason for this is that the barrier layer 62 is electrically connected to the support layer 66 described below and the second power may be supplied through the support layer 66.

The insulating layer 50 is disposed between the metal layers 40-1 to **40-*n* (for example, n=9). The insulating layer 50 is disposed between the metal layers 40-1 to 40-*n* (for example, n=9), and between metal layers 40-1 to 40-*n* (for example, n=8), other than the metal layer (for example, 40-9) connected to the second electrode unit 60, and the second electrode unit 60**.

The insulating layer 50 electrically insulates the metal layers 40-1 to **40-*n* (for example, n=9) and electrically insulates metal layers 40-1 to 40-*n* (for example, n=8), other than the ninth metal layer (for example, 40-9), from the second electrode unit 60**.

The insulating layer 50 may be formed with an insulating material, for example, at least one of $Al_2O_3$, $SiO_2$, $Si_3N_4$, $TiO_2$, and AlN, and may have a single or multiple layer structure.

The support layer 66 is disposed under the barrier layer 62, supports the light emitting structure 10, and supplies power to the light emitting structure 10, together with the first electrode unit 92. The support layer 66 is a conductive material and is a semiconductor material containing a metal material such as copper (Cu), gold (Au), nickel (Ni), molybdenum (Mo), or copper-tungsten (Cu—W), or at least one of Si, Ge, GaAs, ZnO, SiC, and SiGe.

The bonding layer 64 is disposed between the barrier layer 62 and the support layer 66. The bonding layer 64 is interposed between the barrier layer 62 and the support layer 66 to bond the two layers. The bonding layer 64 is formed to bond the support layer 66 in a bonding manner. For this reason, when the support layer 66 is formed using a method such as plating or deposition, or the support layer 66 is a semiconductor layer, the bonding layer 64 may be omitted. The bonding layer 64 contains a bonding metal material, for example, at least one of Au, Sn, Ni, Nb, In, Cu, Ag and Pd.

The first electrode unit 92 is disposed on the first conductive type semiconductor layer 16 in one light emitting region (for example, P1) among the light emitting regions P1 to Pn (for example, n=9). The first electrode unit 92 may include a first pad bonded to a wire to supply a first power. In the embodiment of FIG. 10, the first electrode unit 92 may serve as the first pad. The upper surface of the first conductive type semiconductor layer 16 may be provided with a roughness 16-1 in order to improve light extraction efficiency.

The passivation layer 25 may be disposed in the light emitting regions P1 to Pn (in which n is a natural number greater than 1) and the boundary region S. The passivation layer 25 may be disposed on sides and upper surfaces of light emitting regions P1 to Pn (for example, n=9) and on boundary region S. For example, the passivation layer 25 may be disposed on the side of the first conductive type semiconductor layer 16, the side of the active layer 14 and the side of the second conductive type semiconductor layer 12 included in the each light emitting region P1 to Pn (for example, n=9), and the passivation layer 25 may be disposed on the upper surface of the first conductive type semiconductor layer 16 in each light emitting region P1 to Pn (for example, n=9). In addition, the passivation layer 25 may be disposed on the protective layer 20 of the boundary S. The first electrode unit 92 may be exposed from the passivation layer 25.

The connection electrodes 360-1 to **360-*m* (in which m is a natural number of 1 or more) may be disposed on the passivation layer 25** positioned in adjacent light emitting regions and boundary region provided therebetween.

Each connection electrode 360-1 to **360-*m* (in which m is a natural number of 1 or more) electrically connects the first conductive type semiconductor layer 16 in one light emitting region of adjacent light emitting regions to the second conductive type semiconductor layer 12 in the other light emitting region thereof. The $k^{th}$ connection electrode (for example, 360-1) may electrically connect the second conductive type semiconductor layer 12 of the $k^{th}$ light emitting region to the first conductive type semiconductor layer 16** of the $K+1^{th}$ light emitting region.

The connection electrode 360-1 to **360-*m* (in which m is a natural number of 1 or more) may include at least one first portion that passes through the passivation layer 25, the first conductive type semiconductor layer 16 and the active layer 14, and contacts the second conductive type semiconductor layer 12** in one of adjacent light emitting regions.

In addition, the connection electrode 360-1 to **360-*m* (in which m is a natural number of 1 or more) may include at least one second portion that passes through the passivation layer 25 and contacts the first conductive type semiconductor layer 16** in the other of the adjacent light emitting regions.

Referring to FIG. 10, the $k^{th}$ connection electrode (for example, k=1) may be positioned in the $k^{th}$ light emitting region (for example, K=1), the $k+1^{th}$ light emitting region (for example, K=1), and the boundary S provided therebetween.

Referring to FIG. 11, the $k^{th}$ connection electrode (for example, k=7) may include at least one first portion (for example, 301) that passes through the passivation layer 25, the first conductive type semiconductor layer 16 and the active layer 14, and contacts the second conductive type semiconductor layer 12 of the $K^{th}$ light emitting region (for example, k=7). The dot-lined circle shown in FIG. 10 represents the first portion 301 of the connection electrodes (360-1 to 360-*m*, for example, m=8).

The $k^{th}$ connection electrode (for example, k=7) may include at least one second portion (for example, 302) that passes through the passivation layer 25 of the $K+1^{th}$ light emitting region (for example, k=7) and contacts the first conductive type semiconductor layer 16. The full-lined circle shown in FIG. 10 represents the second portion 302 of the connection electrodes 360-1 to 360-*m* (for example, m=8).

The passivation layer 25 may be positioned between the first portion 301 of the $k^{th}$ connection electrode (for example, k=7) and the first conductive type semiconductor layer 16, and between the first portion 301 of the $k^{th}$ connection electrode (for example, k=7) and the active layer 14. That is, the passivation layer 25 may serve as an insulating layer that electrically insulates the first portion 301 of the $k^{th}$ connection electrode (for example, 360-7) from the first conductive type semiconductor layer 16 and the active layer 14 in the $K^{th}$ light emitting region (for example, P7).

A lower surface of the first portion 301 of the $k^{th}$ connection electrode (for example, 360-7) may be disposed to be lower than a lower surface of the active layer 124. The first portion 301 may have a structure of a hole or groove filled with an electrode material.

The intermediate pads 94 and 96 are disposed on the first conductive type semiconductor layer 16 in at least one of the light emitting regions P1 to Pn (in which n is a natural number greater than 1) and may be electrically connected to the first conductive type semiconductor layer 16. The intermediate pads 94 and 96 may be bonded to wires (not shown) to supply a second power.

For example, the intermediate pads 94 and 96 may be disposed on the first conductive type semiconductor layer 16 in at least one (for example, P4 and P7) of light emitting regions (for example, P2 to P8) other than a light emitting region (for example, P1) in which the first electrode unit 92 is disposed, and a light emitting region (for example, P9) connected to the metal layer (for example, 40-9) electrically connected to the second electrode unit 60.

As shown in FIG. 10, the intermediate pad (for example, 94) may be electrically isolated or separated from the connection electrode (for example, 360-3) disposed in the same light emitting region (for example, P4). However, in other embodiments, the intermediate pad (for example, 94) may be electrically connected to the connection electrode (for example, 360-3) disposed in the same light emitting region (for example, P4).

This embodiment may be designed such that a part or entirety of light emitting regions P1 to Pn (in which n is a natural number of 1 or more) is driven by supplying a first power to any one of the first electrode unit 92 and the intermediate pads 94 and 96 according to applied driving voltage.

Figure 12:
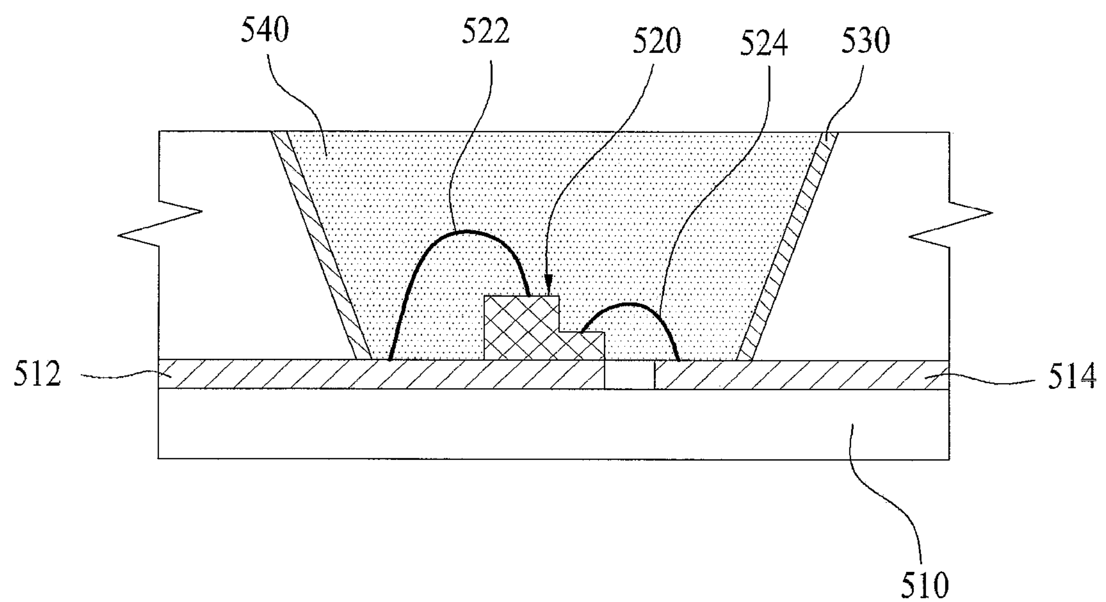
FIG. 12 is a sectional view illustrating a light emitting device package including a light emitting device according to one embodiment.

FIG. 12 is a sectional view illustrating a light emitting device package including a light emitting device in accordance with one embodiment.

With reference to FIG. 12, the light emitting device package includes a package body 510, a first lead frame 512, a second lead frame 514, a light emitting device 520, a reflective plate 530, wires 522 and 524, and a resin layer 540.

The package body 510 has a structure with a cavity at one side region thereof. Here, the side wall of the cavity may be inclined. The package body 510 may be formed of a substrate having excellent insulation and thermal conductivity, such as a silicon-based wafer level package, a silicon substrate, silicon carbide (SiC), aluminum nitride (AlN), or the like, and may have a structure in which plural substrates are stacked. This embodiment is not limited to the above-described material, structure and shape of the package body 510.

The first lead frame 512 and the second lead frame 514 are disposed on the surface of the package body 510 so as to be electrically separated from each other in consideration of heat dissipation or mounting of the light emitting device 520. The light emitting device 520 is electrically connected to the first lead frame 512 and the second lead frame 514 through the first wire 522 and the second wire 524. Here, the light emitting device 520 may be one of the light emitting devices 100, 200 and 300 according to the afore-mentioned embodiments.

For example, in the light emitting device 100 illustrated in FIG. 1, the first electrode unit 150 is electrically connected to the second lead frame 514 through the second wire 524. Also, one of the second pad 172 of the second electrode unit 170 and the intermediate pads 182 and 184 may be electrically connected to the first lead frame 512 through the first wire 522.

For example, in the light emitting device 200 illustrated in FIG. 6, the second electrode unit 272 is electrically connected to the first lead frame 512 through the first wire 522. Also, one of the first electrode unit 250 and intermediate pads 252 and 254 may be electrically connected to the second lead frame 514 through the second wire 524.

For example, in the light emitting device 300 illustrated in FIG. 10, the support layer 66 is bonded to the first lead frame 512. Also, one of the first electrode unit and intermediate pads 94 and 96 may be electrically connected to the second lead frame 514 through the second wire 524.

The reflective plate 530 may be formed on the side wall of the cavity of the package body 510 to guide light emitted from the light emitting device 520 in a designated direction. The reflective plate 530 may be formed of a light reflective material, for example, metal coating or metal flakes.

The resin layer 540 surrounds the light emitting device 520 located within the cavity of the package body 510, and protects the light emitting device 520 from external environments. The resin layer 540 may be formed of a colorless transparent polymer resin material, such as epoxy or silicon. The resin layer 540 may include phosphors to change the wavelength of light emitted from the light emitting device 520. The light emitting device packages may include at least one of light emitting devices according to the afore-mentioned embodiments, but the disclosure is not limited thereto.

An array of plural light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a backlight unit.

In accordance with other embodiments, the light emitting devices or the light emitting device package in accordance with the above-described embodiments may constitute a display apparatus, an indicating apparatus and a lighting system, and, for example, the lighting system may include a lamp or a streetlight.

Figure 13:
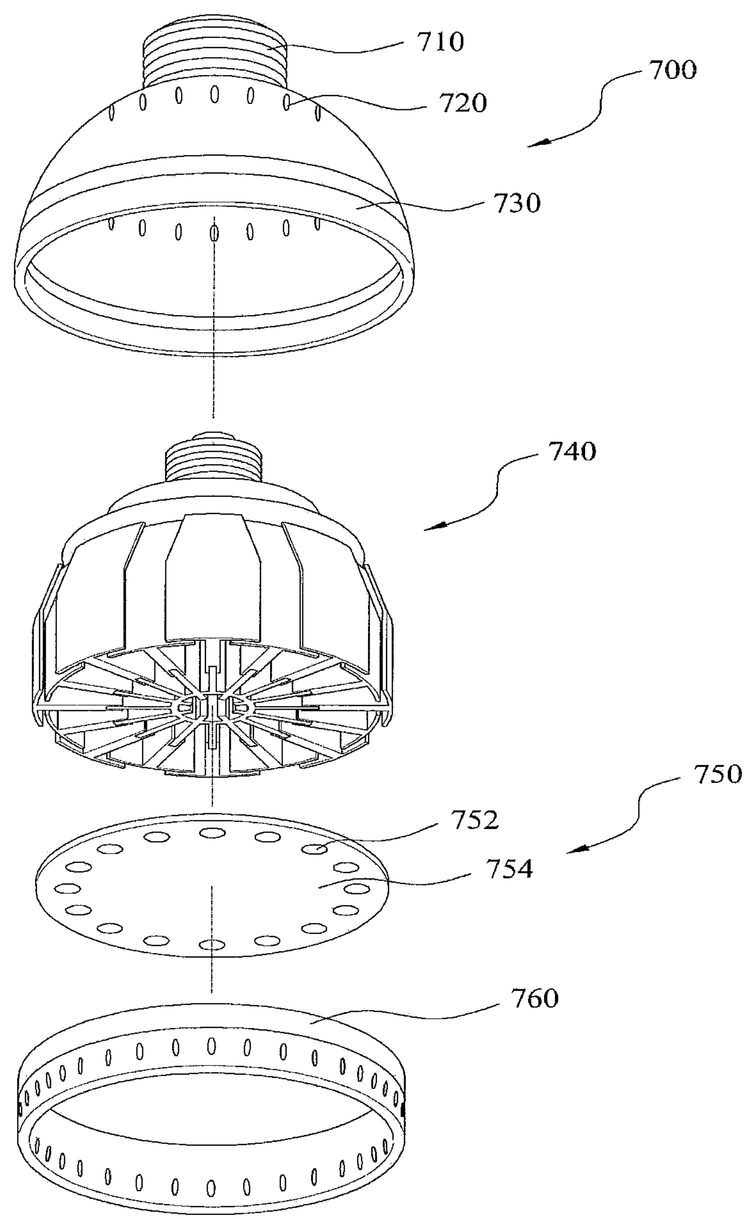
FIG. 13 is an exploded perspective view of a lighting apparatus including the light emitting device package according to one embodiment.

FIG. 13 is an exploded perspective view of a lighting apparatus including light emitting device packages in accordance with one embodiment. With reference to FIG. 13, the lighting apparatus in accordance with this embodiment includes a light source 750 to project light, a housing 700 in which the light source 750 is installed, a heat dissipation unit 740 to dissipate heat generated by the light source 750, and a holder 760 to couple the light source 750 and the heat dissipation unit 740 to the housing 700.

The housing 700 includes a socket connector 710 connected to an electrical socket (not shown) and a body 730 connected to the socket connector 710 and accommodating the light source 750. One air flow hole 720 may be formed through the body 730.

A plurality of air flow holes 720 may be provided on the body 730 of the housing 700. One air flow hole 720 may be formed, or plural air flow holes 720 may be arranged, in a radial shape or various other shapes.

The light source 750 includes a plurality of light emitting device packages 752 provided on a substrate 754. Here, the substrate 754 may have a shape which is capable of being inserted into an opening of the housing 700, and be formed of a material having high thermal conductivity so as to transfer heat to the heat dissipation unit 740, as described later. A plurality of light emitting device package may a light emitting device package according to the aforementioned embodiment.

The holder 760 is provided under the light source 750. The holder 760 may include a frame and air flow holes. Further, although not shown in FIG. 12, optical members may be provided under the light source 750 so as to diffuse, scatter or converge light emitted from the light emitting device packages 752 of the light source 750.

Figure 14:
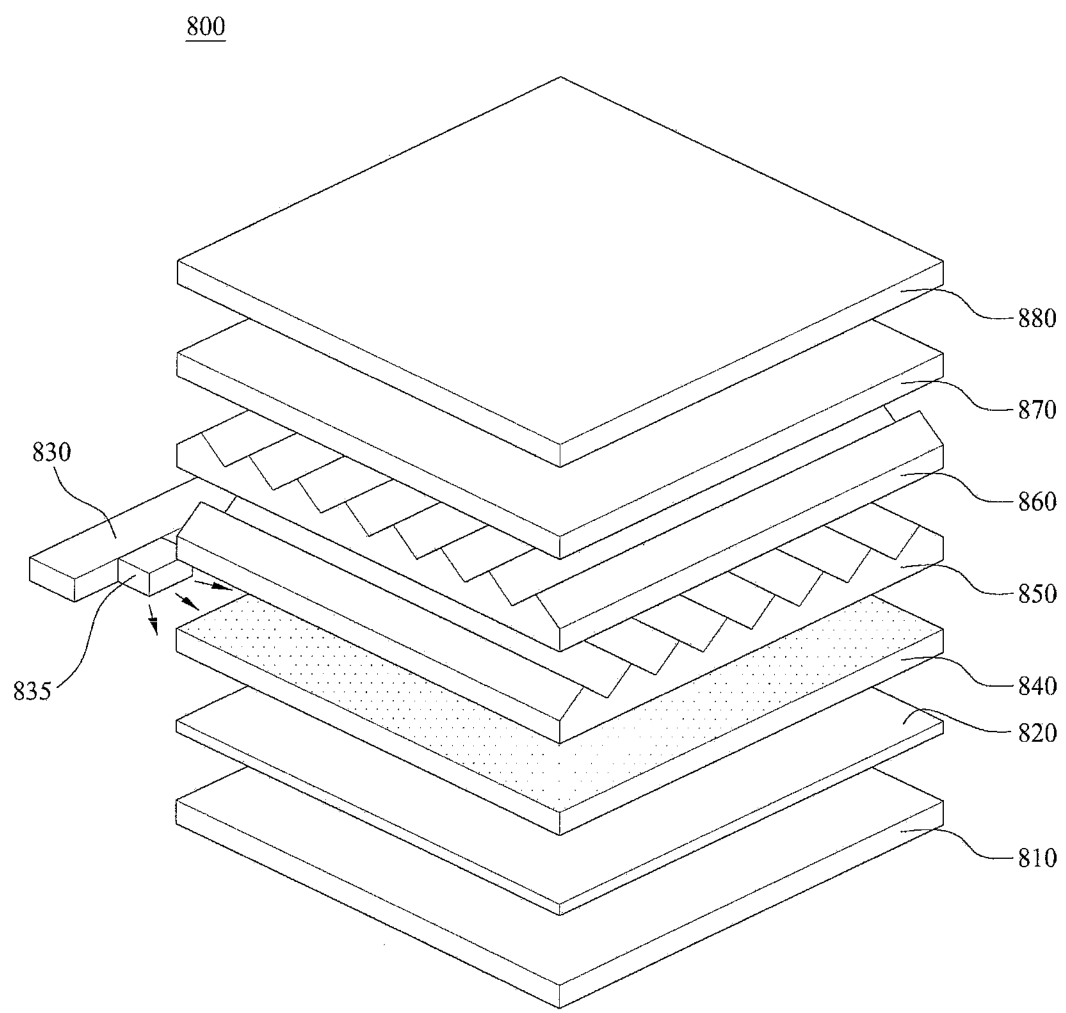
FIG. 14 is an exploded perspective view of a display apparatus including the light emitting device package according to one embodiment.

FIG. 14 is an exploded perspective view of a display apparatus 800 including light emitting device packages according to one embodiment.

Referring to FIG. 14, the display apparatus 800 includes a bottom cover 810, a reflective plate 820 disposed on the bottom cover 810, light emitting modules 830 and 835 to emit light, a light guide plate 840 disposed on the front surface of the reflective plate 820 to guide light emitted from the light emitting modules 830 and 835 to the front part of the display device, an optical sheet including prism sheets 850 and 860 disposed on the front surface of the light guide plate 840, a display panel 870 disposed on the front surface of the optical sheet, an image signal output circuit 872 connected to the display panel 870 to supply an image signal to the display panel 870, and a color filter 880 disposed on the front surface of the display panel 870. Here, the bottom cover 810, the reflective plate 820, the light emitting modules 830 and 835, the light guide plate 840, and the optical sheet may constitute a backlight unit.

The light emitting modules may include a light emitting device package 835 on the substrate 830. Here, the substrate 830 may be formed of PCB or the like. The light emitting device package 835 may be the light emitting device package according to the afore-mentioned embodiment.

The bottom cover 810 may accommodate components within the image display apparatus 800. The reflective plate 820 may be provided as a separate component, as shown in FIG. 13, or be provided by coating the rear surface of the light guide plate 840 or the front surface of the bottom cover 810 with a material having high reflectivity.

The reflective plate 820 may be formed of a material that has high reflectivity and may be useful in an ultra-thin form, such as polyethylene terephthalate (PET).

The light guide plate 840 is formed of a material having a high index of refraction and high transmittance, such as polymethylmethacrylate (PMMA), polycarbonate (PC) or polyethylene (PE).

The first prism sheet 850 is formed of a light transmitting and elastic polymer on one surface of a support film, and the polymer may have a prism layer in which plural three-dimensional structures are repeated. Here, such plural patterns may be formed in a strip manner in which ridges and valleys are repeated, as shown in the drawing.

A direction of ridges and valleys formed on one surface of a support film of the second prism sheet 860 may be perpendicular to a direction of the ridges and the valleys formed on one surface of the support film of the first prism sheet 850. This serves to uniformly distribute light transmitted from the light source module and the reflective plate 820 in all directions of the panel 870.

Although not shown, a diffusion sheet may be disposed between the light guide plate 840 and the first prism sheet 850. The diffusion sheet may be made of polyester and polycarbonate and maximizes a light projection angle of light emitted from the backlight unit through refraction and scattering. Also, the diffusion sheet may include a support layer including a light diffusion agent, and a first layer and a second layer that are formed on a light projection surface (first prism sheet direction) and a light incident surface (reflective sheet direction) and do not include a light diffusion agent.

Although this embodiment illustrates optical sheets as including the diffusion sheet, the first prism sheet 850 and the second prism sheet 860, the optical sheets may include another combination, for example, a micro lens array, a combination of a diffusion sheet and a micro lens array, or a combination of one prism sheet and a micro lens array.

As the display panel 870, a liquid crystal display panel may be provided, or other kinds of display apparatuses requiring a light source may be provided instead of the liquid crystal display panel.

As is apparent from the above description, the light emitting device according to the embodiments controls emission of light with various brightness levels, increases a light emitting area and disperses current, thus improving light emission efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:

a light emitting structure divided into first to $n^{th}$ (where n is a natural number greater than 1) light emitting regions comprising a first semiconductor layer, an active layer and a second semiconductor layer and at least one boundary region disposed between the first to $n^{th}$ light emitting regions;

a first electrode unit disposed on the first semiconductor layer in one of the first to $n^{th}$ light emitting regions;

a second electrode unit disposed on the second semiconductor layer in another of the first to $n^{th}$ light emitting regions;

at least one connection electrode configured to connect in series the first to $n^{th}$ light emitting regions, the first semiconductor layer of one of adjacent light emitting regions among the first to $n^{th}$ light emitting regions being configured to be connected to the second semiconductor layer of the other thereof through the at least one connection electrode; and an intermediate pad disposed on the first semiconductor layer or the second semiconductor layer in at least one of the first to $n^{th}$ light emitting regions.

2. The light emitting device according to claim 1, wherein the intermediate pad is disposed on the second semiconductor layer in at least one of light emitting regions, other than light emitting regions in which the first electrode unit and the second electrode unit are positioned, among the first to $n^{th}$ light emitting regions.

3. The light emitting device according to claim 1, wherein the intermediate pad is disposed on the first semiconductor layer in at least one of light emitting regions, other than light emitting regions in which the first electrode unit and the second electrode unit are positioned, among the first to $n^{th}$ light emitting regions.

4. The light emitting device according to claim 1, wherein each of the first electrode unit and the second electrode unit comprises a pad to receive a power.

5. The light emitting device according to claim 1, wherein the intermediate pad is electrically connected to the connection electrode disposed in the same light emitting region.

6. The light emitting device according to claim 1, further comprising:

an insulating layer disposed in the first to $n^{th}$ light emitting regions and the boundary region, wherein the connection electrode is disposed on the insulating layer.

7. The light emitting device according to claim 6, wherein the connection electrode comprises:

a first portion that passes through the insulating layer and contacts the second semiconductor layer in one of the adjacent light emitting regions; and a second portion that passes through the insulating layer, the second semiconductor layer and the active layer, and contacts the first semiconductor layer in the other of the adjacent light emitting regions, wherein the insulating layer is disposed between the second portion and the second semiconductor layer, and between the second portion and the active layer.

8. The light emitting device according to claim 7, wherein a lower surface of the second portion of the connection electrode is positioned to be lower than a lower surface of the active layer.

9. The light emitting device according to claim 7, further comprising:

a substrate disposed under the light emitting structure; and a conductive layer disposed between the first to $n^{th}$ light emitting regions and the insulating layer.

10. The light emitting device according to claim 9, wherein the second portion passes through the conductive layer.

11. The light emitting device according to claim 10, wherein the insulating layer is disposed between the second portion and the conductive layer.

12. The light emitting device according to claim 1, wherein the first electrode unit receives a first power and at least one of the second electrode unit and the intermediate pad receives a second power.

13. A light emitting device, comprising:

a light emitting structure divided into first to $n^{th}$ (where n is a natural number greater than 1) light emitting regions comprising a first semiconductor layer, an active layer and a second semiconductor layer and at least one boundary region disposed between the first to nth light emitting regions;

a first electrode unit disposed on the first semiconductor layer in one of the first to $n^{th}$ light emitting regions;

a plurality of metal layers disposed under the second semiconductor layers in the respective first to $n^{th}$ light emitting regions;

a second electrode unit connected to a metal layer disposed under the second semiconductor layer in another of the first to nth light emitting regions;

an insulating layer to electrically insulate the metal layers from each other;

at least one connection electrode configured to connect in series the first to $n^{th}$ light emitting regions, the first semiconductor layer of one of adjacent light emitting regions among the first to $n^{th}$ light emitting regions being configured to be connected to the second semiconductor layer of the other thereof through the at least one connection electrode; and an intermediate pad disposed on the first semiconductor layer in at least one of the first to $n^{th}$ light emitting regions.

14. The light emitting device according to claim 13, wherein each metal layer includes at least one of an ohmic layer and a reflective layer.

15. The light emitting device according to claim 13, wherein the intermediate pad is disposed on the first semiconductor layer in at least one of light emitting regions, other than the one of the first to $n^{th}$ light emitting regions, in which the first electrode unit is positioned, and the another of the first to $n^{th}$ light emitting regions, with which the second electrode unit is electrically connected.

16. The light emitting device according to claim 13, further comprising:

a passivation layer disposed in the first to $n^{th}$ light emitting regions and the boundary region, wherein the connection electrode is disposed on the passivation layer.

17. The light emitting device according to claim 13, wherein the connection electrode comprises:

at least one first portion that passes through the passivation layer, the first semiconductor layer and the active layer, and contacts the second semiconductor layer in one of the adjacent light emitting regions; and at least one second portion that passes through the passivation layer, and contacts the first semiconductor layer in the other of the adjacent light emitting regions, wherein the passivation layer is disposed between the first portion and the first semiconductor layer, and between the first portion and the active layer.

18. The light emitting device according to claim 13, wherein the second electrode unit comprises:

a barrier layer electrically connected to the metal layer disposed under the second semiconductor layer in the another of the light emitting regions; and a support layer disposed under the barrier layer.

19. The light emitting device according to claim 13, further comprising:

a current blocking layer disposed between the second semiconductor layer and the metal layer in each of the first to $n^{th}$ light emitting regions, the current blocking layer at least partially overlapping the connection electrode or the intermediate pad in a vertical direction.

20. The light emitting device according to claim 13, wherein the insulating layer electrically insulates metal layers other than the metal layer electrically connected to the second electrode unit, from the second electrode.

* * * * *